United States Patent
Ohno et al.

(10) Patent No.: US 9,422,640 B2
(45) Date of Patent: Aug. 23, 2016

(54) SINGLE-CRYSTAL 4H-SIC SUBSTRATE

(71) Applicant: Mitsubishi Electric Corporation, Tokyo (JP)

(72) Inventors: Akihito Ohno, Tokyo (JP); Zempei Kawazu, Tokyo (JP); Nobuyuki Tomita, Tokyo (JP); Takanori Tanaka, Tokyo (JP); Yoichiro Mitani, Tokyo (JP); Kenichi Hamano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 228 days.

(21) Appl. No.: 14/149,942

(22) Filed: Jan. 8, 2014

(65) Prior Publication Data

US 2014/0295136 A1 Oct. 2, 2014

(30) Foreign Application Priority Data

Mar. 26, 2013 (JP) ................. 2013-064365

(51) Int. Cl.
*C30B 29/68* (2006.01)
*C30B 25/20* (2006.01)
*C30B 29/36* (2006.01)

(52) U.S. Cl.
CPC .............. *C30B 29/68* (2013.01); *C30B 25/20* (2013.01); *C30B 29/36* (2013.01); *Y10T 428/24331* (2015.01); *Y10T 428/24612* (2015.01)

(58) Field of Classification Search
CPC ........ C30B 29/68; C30B 25/20; C30B 29/36; Y10T 428/24331; Y10T 428/24612
See application file for complete search history.

(56) References Cited

U.S. PATENT DOCUMENTS

| 6,734,461 B1* | 5/2004 | Shiomi ............ C30B 23/00 257/194 |
|---|---|---|
| 2011/0221039 A1 | 9/2011 | Singh et al. |
| 2012/0142173 A1* | 6/2012 | Watanabe ......... H01L 21/02378 438/504 |
| 2012/0280254 A1 | 11/2012 | Muto et al. |
| 2013/0040103 A1 | 2/2013 | Asamura et al. |
| 2014/0339571 A1 | 11/2014 | Momose et al. |

FOREIGN PATENT DOCUMENTS

| JP | 9-52796 A | 2/1997 |
| JP | 2007-299877 A | 11/2007 |
| JP | 2011-49496 A | 3/2011 |
| JP | 2011-225421 A | 11/2011 |
| KR | 10-2012-0137411 A | 12/2012 |

OTHER PUBLICATIONS

Powell, J. et al.; "Surface Morphology of Silicon Carbide Epitaxial Films", *J. of Electronic Materials*, vol. 24, No. 4, pp. 295-301, (1995).

(Continued)

*Primary Examiner* — Laura Auer
(74) *Attorney, Agent, or Firm* — Leydig, Voit & Mayer, Ltd.

(57) ABSTRACT

A method for manufacturing a single-crystal 4H-SiC substrate includes: preparing a flat 4H-SiC bulk single-crystal substrate; and epitaxially growing a first single-crystal 4H-SiC layer having recesses on the 4H-SiC bulk single-crystal substrate, wherein the first single-crystal 4H-SiC layer has a thickness of X ($\mu$m), the recesses have a diameter Y ($\mu$m) no smaller than 0.2*X ($\mu$m) and no larger than 2*X ($\mu$m), and a depth of Z (nm) no smaller than (0.95*X ($\mu$m)+0.5 (nm)) and no larger than 10*X ($\mu$m).

12 Claims, 3 Drawing Sheets

(56) References Cited

OTHER PUBLICATIONS

Korean Patent Office; Office Action in corresponding Korean Patent Application No. 10-2014-0030851 (May 13, 2015).

German Patent Office; Office Action in German Patent Application No. 10 2014 205 466.4 (Nov. 10, 2015).

State Intellectual Property Office of the People'S Republic of China; Office Action in Chinese Patent Application No. 201410112911.3, (Apr. 26, 2016).

* cited by examiner

SINGLE-CRYSTAL 4H-SIC SUBSTRATE

BACKGROUND OF THE INVENTION

1. Field of the Invention

The present invention relates to a single-crystal 4H-SiC substrate and method for manufacturing the same having a reduced crystal defect density.

2. Background Art

Recently, much attention has been given to the use of silicon carbide (or SiC) as a material primarily for power control devices, since SiC is superior to silicon in terms of breakdown field strength, saturated drift velocity, and thermal conductivity. Power devices formed of SiC can be configured to have substantially reduced power loss and a reduced size, allowing power saving in power conversion. Therefore, these power devices can be used to enhance the performance of electric vehicles and the functionality of solar cell systems, etc., and hence are a key element in creating a low-carbon society.

The doping density and the thickness of a substrate on which an SiC power device is to be formed are determined substantially by the specifications of the device and therefore are typically required to be controlled more accurately than the doping density and the thickness of a bulk single-crystal substrate. In order to meet this requirement, an active region for the semiconductor device is epitaxially grown on a 4H-SiC bulk single-crystal substrate beforehand by thermal chemical vapor deposition (thermal CVD), etc. It should be noted that the term "active region," as used herein, refers to a region having an accurately controlled thickness and an accurately controlled doping density in its crystal structure.

4H-SiC bulk single-crystal substrates inherently contain screw dislocations, which propagate in the c-axis direction, edge dislocations, and basal plane dislocations, which propagate perpendicular to the c-axis. These dislocations propagate into the epitaxial film grown on the substrate. Furthermore, new dislocation loops and stacking faults are introduced into the substrate during the epitaxial growth process. These crystal defects may degrade the breakdown voltage characteristics, reliability, and yield of the device formed using the SiC substrate and thereby prevent the practical use of the device.

It should be noted that methods of manufacturing a single-crystal 3C-SiC substrate have been proposed in which a single-crystal 3C-SiC layer is formed to have a flat surface interspersed with surface pits, which serves to reduce crystal defects (see, e.g., Japanese Laid-Open Patent Publication No. 2011-225421).

SUMMARY OF THE INVENTION

Since 3C-SiC is a cubic crystal and 4H-SiC is a hexagonal crystal, they have different crystal structures, i.e., different atomic arrangements, and hence have substantially different optimum growth conditions. For example, whereas 3C-SiC has an optimum growth temperature range of 1000-1100° C., 4H-SiC has a very high optimum growth temperature range of 1600-1800° C. As a result, the currently available methods for reducing crystal defects in a single-crystal 3C-SiC substrate cannot be applied to single-crystal 4H-SiC substrates. Heretofore there has been no known method for reducing crystal defects in a single-crystal 4H-SiC substrate.

In view of the above-described problems, an object of the present invention is to provide a single-crystal 4H-SiC substrate and method for manufacturing the same having a reduced crystal defect density.

According to the present invention, a method for manufacturing a single-crystal 4H-SiC substrate includes: preparing a 4H-SiC bulk single-crystal substrate having flatness; and forming a first single-crystal 4H-SiC layer having recesses on the 4H-SiC bulk single-crystal substrate, using an epitaxial method, wherein thickness of the first single-crystal 4H-SiC layer is X measured in micrometers ($\mu$m), the recesses have a diameter Y, measured in micrometers, no smaller than $0.2*X$ and no larger than $2*X$, and the recesses have a depth Z, if measured in micrometers ($\mu$m), no smaller than $(0.95*X+0.5) 10^{-3}$ and no larger than $10*X*10^{-3}$.

The present invention makes it possible to reduce a crystal defect density of a single-crystal 4H-SiC substrate.

Other and further objects, features and advantages of the invention will appear more fully from the following description.

DETAILED DESCRIPTION OF THE PREFERRED EMBODIMENTS

A single-crystal 4H-SiC substrate and method for manufacturing the same according to the embodiments of the present invention will be described with reference to the drawings. The same components will be denoted by the same symbols, and the repeated description thereof may be omitted.

First Embodiment

Figure 1:
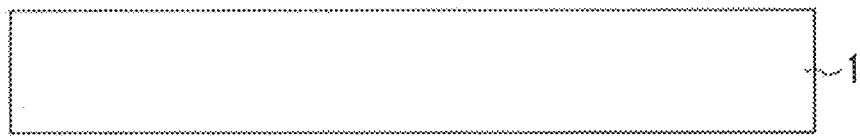
FIGS. 1 and 2 are cross-sectional views showing the method of manufacturing a single-crystal 4H-SiC substrate in accordance with the first embodiment.
Figure 2:
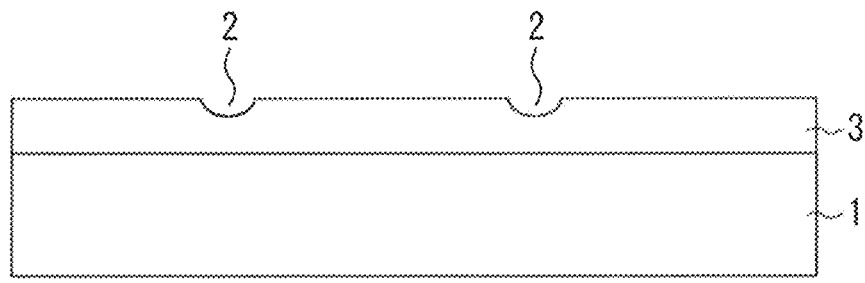

A method of manufacturing a single-crystal 4H-SiC substrate in accordance with a first embodiment of the present invention will be described. FIGS. 1 and 2 are cross-sectional views showing the method of manufacturing a single-crystal 4H-SiC substrate in accordance with the first embodiment.

The method begins by preparing a 4H-SiC bulk single-crystal substrate 1 misoriented by 4 degrees from the (0001) plane (or C-plane) toward a <11-20> direction, as shown in FIG. 1. (The completed single-crystal 4H-SiC substrate of the present embodiment will have a principal surface in the (0001) plane.) It should be noted that the misorientation angle need not necessarily be 4 degrees, but may be in the range of 2-10 degrees.

Specifically, the 4H-SiC bulk single-crystal substrate 1 is planarized by mechanical polishing and chemical mechanical polishing using an acidic or alkaline solution. Further, the substrate 1 is ultrasonically cleaned using acetone to remove organic matter. The 4H-SiC bulk single-crystal substrate 1 is then subjected to the so-called RCA cleaning. Specifically, the 4H-SiC bulk single-crystal substrate 1 is immersed in a mixture (1:9) of aqueous ammonia and hydrogen peroxide solution for 10 minutes after the mixture has been heated to 75° C. (±5° C.). The substrate 1 is then immersed in a mixture (1:9) of hydrochloric acid and hydrogen peroxide solution after the mixture has been heated to 75° C. (±5° C.). Further, the 4H-SiC bulk single-crystal substrate 1 is immersed in an aqueous solution containing approximately 5 volume percent of hydrofluoric acid, and then is subjected to substitution treatment using purified water, thus cleaning the surface of the 4H-SiC bulk single-crystal substrate 1.

Next, the 4H-SiC bulk single-crystal substrate 1 is introduced into a CVD apparatus, which is then evacuated to approximately $1\times10^{-7}$ kPa. The substrate 1 is then heated to approximately 1400-1700° C. and annealed in a reducing gas atmosphere. Then, as shown in FIG. 2, material gases are supplied to the growth furnace so that a single-crystal 4H-SiC layer 3 is epitaxially grown on the 4H-SiC bulk single-crystal substrate 1 and has recesses 2 having a diameter of 2-20 μm and a maximum depth of 10-100 nm. These material gases include, e.g., silane gas ($SiH_4$) which is used as a Si atom source, propane gas ($C_3H_8$) which is used as a C atom source, and nitrogen gas serving as an N-type dopant. In this example, the single-crystal 4H-SiC layer 3 is formed to a thickness of 10 μm by supplying $SiH_4$ gas at a flow rate of 500 sccm and $C_3H_8$ gas at a flow rate of 200 sccm. Further, nitrogen gas serving as an N-type dopant is supplied so that the substrate interface has a carrier concentration of $1\times10^{17}/cm^3$ and the active region has a carrier concentration of $8\times10^{15}/cm^3$. The supply of material gas is then stopped and the temperature of the substrate 1 is decreased to room temperature.

Figure 3:
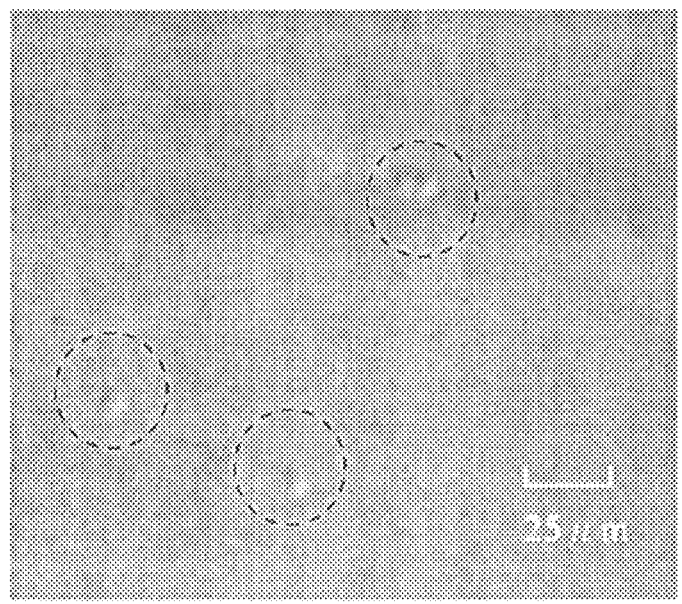
FIG. 3 is an optical micrograph image of recesses formed in the growth surface of the single-crystal 4H-SiC layer 3.
Figure 4:
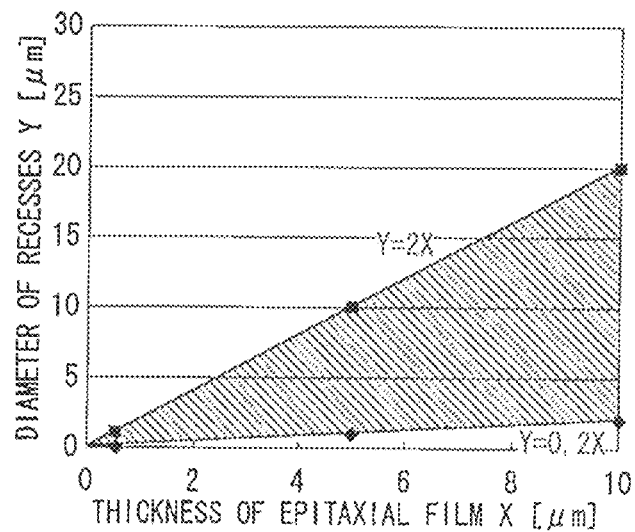
FIG. 4 is a diagram showing the diameter of the recesses as a function of the thickness of the epitaxial film.
Figure 5:
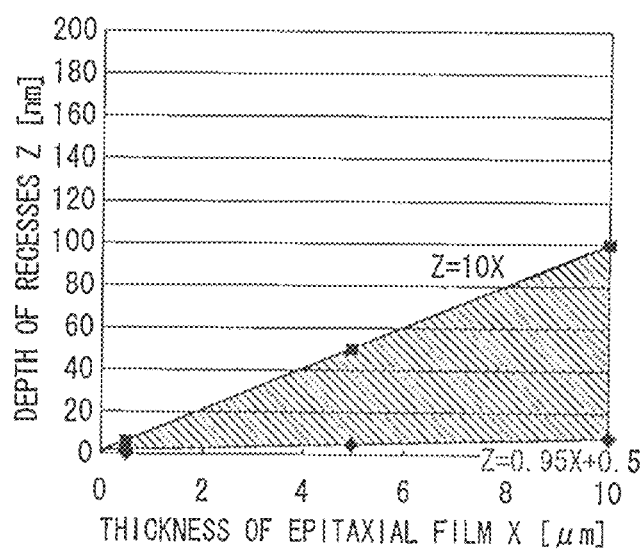
FIG. 5 is a diagram showing the depth of the recesses as a function of the thickness of the epitaxial film.

The present inventor has found that minute recesses 2 are formed in the growth surface of the single-crystal 4H-SiC layer 3 if the temperature and the pressure in the growth furnace are appropriately set during the growth of the layer 3. FIG. 3 is an optical micrograph image of recesses formed in the growth surface of the single-crystal 4H-SiC layer 3. The density of the recesses 2 was found, using an optical microscope, to be approximately $600/cm^2$. The shape of the recesses 2 was observed under an atomic force microscope and found to be a nonsymmetrical elliptical cone having a diameter of 2-20 micrometer (μm) and a maximum depth of 10-100 nanometer (nm). More detailed experiments were conducted repeatedly and revealed that the size of the recesses varies with the thickness of the formed epitaxial film and that the greater the thickness of the film, the greater the diameter and the depth of the recesses. FIG. 4 is a diagram showing the diameter of the recesses, measured in micrometers (μm), as a function of the thickness of the epitaxial film, measured in (μm). FIG. 5 is a diagram showing the depth of the recesses measured in nanometers (nm), as a function of the thickness of the epitaxial film, measured in micrometers (μm). The results of the experiments show that, when the thickness of the epitaxial film is X (μm), the diameter Y (μm) of the recesses is no less than 0.2*X (μm) and no more than 2*X (μm), and the depth Z of the recesses, when measured in micrometers (μm), is no smaller than $(0.95*X+0.5) 10^{-3}$ and no larger than $10*X*10^{-3}$. FIG. 5 shows that when the thickness of the film is 8 micrometers (μm), the maximum recess depth within the scope of the invention is 80 nanometers (nm), i.e., 0.08 micrometers (μm) and the minimum recess depth within the scope the invention is 8.1 nanometers (nm), i.e., 0.0081 micrometers (μm).

Figure 6:
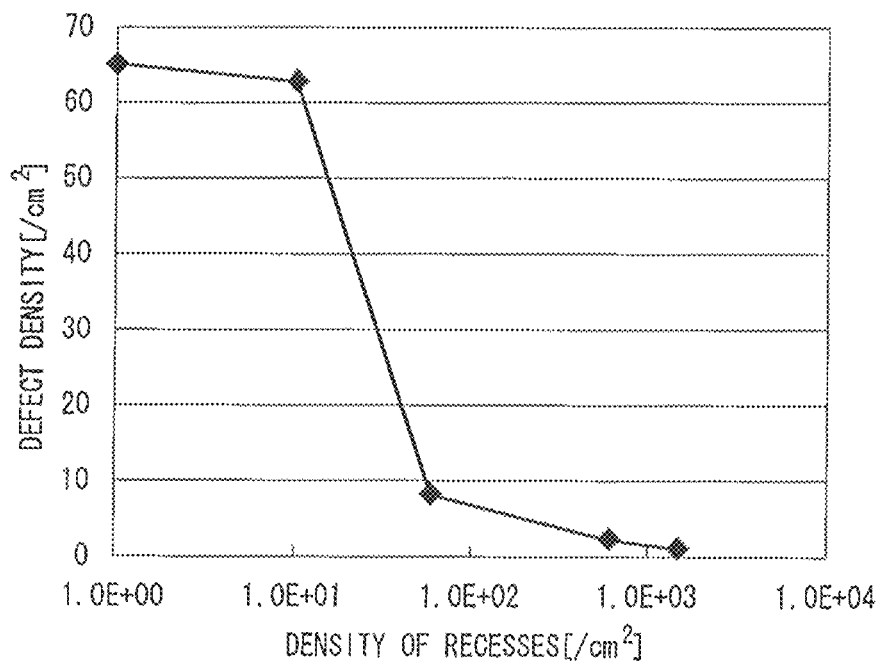
FIG. 6 is a diagram showing the defect density of the single crystal 4H-SiC layer as a function of the recess density of the surface of the layer.

FIG. 6 is a diagram showing the defect density of the single crystal 4H-SiC layer as a function of the recess density of the surface of the layer. The defect density was obtained by photoluminescence topography (PL-TOPO). It should be noted that the term "defect," as used herein, corresponds to or is defined as an anomalously luminous region observed by PL-TOPO. In the case of a conventional substrate having a single-crystal 4H-SiC layer formed under typical conventional growth conditions, the density of the recesses in the surface of the single-crystal 4H-SiC layer was less than $10/cm^2$; substantially no recesses were found under an optical microscope. In this case, the defect density was $60/cm^2$ or more. It should be noted that the electrodes of some devices have a large surface area (e.g., 1-2 mm square), in which case if these devices are formed on a conventional single-crystal 4H-SiC substrate, then more than one defect will be located under the electrodes, resulting in degraded breakdown voltage characteristics of the device.

In the case of the single-crystal 4H-SiC substrate of the present embodiment, on the other hand, the defect density is considerably low (namely, $2/cm^2$), as compared with prior art substrates of the same type, since the density of the recesses 2 formed in the surface of the single-crystal 4H-SiC layer 3 is $10/cm^2$ or more. When the density of the recesses 2 was $1500/cm^2$, the defect density was found to be extremely low (namely, $1/cm^2$).

As described above, in the present embodiment, the single-crystal 4H-SiC layer 3 is grown to have recesses having a diameter Y (μm) of no less than 0.2*X (μm) and no more than 2*X (μm), and a depth Z (nm) of no less than (0.95*X (μm)+ 0.5 (nm)) and no more than 10*X (μm), where X is the thickness of the single-crystal 4H-SiC layer 3 in μm. This results in a reduced crystal defect density of the single-crystal 4H-SiC substrate. Further, the use of this high quality single-crystal 4H-SiC substrate makes it possible to improve the breakdown voltage characteristics, reliability, and yield of the device formed thereon.

It should be noted that an organic metal material containing Al, B, or Be and serving as a P-type dopant may be supplied as necessary during the formation of the single-crystal 4H-SiC layer 3. Further, a chlorine-containing gas may be additionally supplied to increase the growth rate of the layer. It has been found that the growth rate of the single-crystal 4H-SiC layer 3 can be varied by varying the flow rate of material gas and that the above advantages of the present embodiment can be achieved regardless of whether the growth rate is 1 μm/h or 10 μm/h.

It has also been found that the density of the recesses 2 can be adjusted by appropriately setting the temperature and the pressure in the growth furnace. It should be noted, however, that such setting or conditions may be greatly dependent on the structure and internal configuration of the furnace of the CVD apparatus; that is, the appropriate conditions vary with the CVD apparatus used.

Second Embodiment

Figure 7:
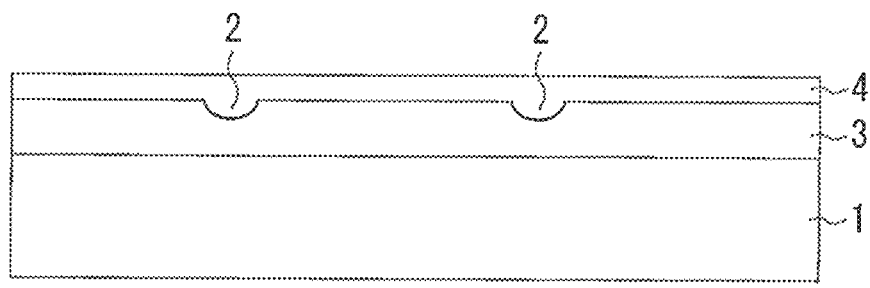
FIG. 7 is a cross-sectional view showing the method of manufacturing a single-crystal 4H-SiC substrate in accordance with the second embodiment.

A method of manufacturing a single-crystal 4H-SiC substrate in accordance with a second embodiment of the present invention will be described. FIG. 7 is a cross-sectional view showing the method of manufacturing a single-crystal 4H-SiC substrate in accordance with the second embodiment.

First, as in the first embodiment, a single-crystal 4H-SiC layer 3 having a thickness of 300 nm is epitaxially grown so that that its growth surface has recesses 2. It should be noted that the thickness of the single-crystal 4H-SiC layer 3 need not necessarily be 300 nm, but may be in the range of from 50 nm to 10 μm. Then, as shown in FIG. 7, a single-crystal 4H-SiC layer 4 having a thickness of 10 μm is epitaxially grown on the single-crystal 4H-SiC layer 3 so as to bury the recesses 2.

Specifically, the single-crystal 4H-SiC layer 4 is formed by supplying SiH$_4$ gas at a flow rate of 900 sccm and C$_3$H$_8$ gas at a flow rate of 360 sccm and further supplying nitrogen gas serving as an N-type dopant so that the layer 4 has a carrier concentration 8×10$^{15}$/cm$^3$. The supply of material gas is then stopped and the temperature of the substrate is decreased to room temperature. Except for this feature, the single-crystal 4H-SiC substrate of the second embodiment is similar in configuration and manufacture to the single-crystal 4H-SiC substrate of the first embodiment.

It should be noted that the recesses 2 of the single-crystal 4H-SiC layer 3 can be buried under the single-crystal 4H-SiC layer 4 by appropriately setting the growth temperature and other growth conditions so as to grow the single-crystal 4H-SiC layer 4 primarily in a step flow growth mode.

The density of the recesses in the surface of the single-crystal 4H-SiC substrate of the present embodiment was found, using an optical microscope, to be very low (namely, approximately 1/cm$^2$). Further, a 10 μm by 10 μm square area of the surface was observed under an atomic force microscope and found to have an average roughness (Ra) of 0.3 nm or less without anomalous growth called step bunching, indicating that the surface was in very good conditions. Further, the defect density of the single-crystal 4H-SiC substrate was found, using PL-TOPO, to be very low (namely, 2/cm$^2$). The low defect density of the completed single-crystal 4H-SiC substrate resulted from the formation of the single-crystal 4H-SiC layer 3 on the 4H-SiC bulk single-crystal substrate 1, which served to reduce the defect density.

In the present embodiment, the single-crystal 4H-SiC layer 4 is formed to bury the recesses 2 of the single-crystal 4H-SiC layer 3. This reduces crystal defects and improves the flatness of the surface of the single-crystal 4H-SiC substrate.

Thus, the single-crystal 4H-SiC substrate of the second embodiment has two single-crystal 4H-SiC layers, one on top of the other, and the lower single-crystal 4H-SiC layer has recesses in its surface. In such single-crystal 4H-SiC substrates, too, the density of the recesses and the defect density are related to each other in the manner shown in FIG. 6 described in connection with the single-crystal 4H-SiC substrate of the first embodiment, which has only one single-crystal 4H-SiC layer. Further, in the single-crystal 4H-SiC substrate of the second embodiment, the single-crystal 4H-SiC layer 3 need not necessarily be formed in contact with the 4H-SiC bulk single-crystal substrate 1; for example, the single-crystal 4H-SiC layer 3 may be sandwiched in the single-crystal 4H-SiC layer 4. This also serves to reduce crystal defects. Thus, the position of the single-crystal 4H-SiC layer 3 relative to the surface of the 4H-SiC bulk single-crystal substrate 1 may be selected according to the specifications of the device formed. As a result, it is possible to control the defect density of the single-crystal 4H-SiC substrate of the second embodiment while accurately controlling the carrier concentration and thickness of the active region.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-064365, filed on Mar. 26, 2013 including specification, claims, drawings and summary, on which the Convention priority of the present application is based, is incorporated herein by reference in its entirety.

What is claimed is:

1. A single-crystal 4H-SiC substrate comprising:
    a 4H-SiC bulk single-crystal substrate; and
    an epitaxial first single-crystal 4H-SiC layer on the 4H-SiC bulk single-crystal substrate and having recesses, wherein
        the epitaxial first single-crystal 4H-SiC layer has a thickness X measured in micrometers (μm),
        the recesses have a diameter Y measured in micrometers, no smaller than 0.2*X, and no larger than 2*X, and
        the recesses have a depth Z, when measured in micrometers, no smaller than $(0.95*X+0.5)*10^{-3}$, and no larger than $10*X*10^{-3}$.

2. The single-crystal 4H-SiC substrate according to claim 1, wherein density of the recesses in the epitaxial first single-crystal 4H-SiC layer is at least 10/cm$^2$.

3. The single-crystal 4H-SiC substrate according to claim 1, further comprising an epitaxial second single-crystal 4H-SiC layer on the epitaxial first single-crystal 4H-SiC layer, burying the recesses.

4. The single-crystal 4H-SiC substrate according to claim 1, wherein the thickness X of the epitaxial first single-crystal 4H-SiC layer is no smaller than 0.3 μm and no larger than 10 μm.

5. The single-crystal 4H-SiC substrate according to claim 4, wherein the epitaxial first single-crystal 4H-SiC layer has a defect density no larger than 2/cm$^2$.

6. The single-crystal 4H-SiC substrate according to claim 4, wherein the epitaxial first single-crystal 4H-SiC layer is doped and is N-type.

7. The single-crystal 4H-SiC substrate according to claim 1, wherein
    the diameter Y of the recesses is no smaller than 2 μm and no larger than 20 μm, and
    the depth Z of the recesses is no smaller than 0.01 μm and no larger than 0.1 μM.

8. The single-crystal 4H-SiC substrate according to claim 7, wherein the epitaxial first single-crystal 4H-SiC layer has a defect density no larger than 2/cm$^2$.

9. The single-crystal 4H-SiC substrate according to claim 7, wherein the epitaxial first single-crystal 4H-SiC layer is doped and is N-type.

10. The single-crystal 4H-SiC substrate according to claim 1, wherein the epitaxial first single-crystal 4H-SiC layer has a defect density no larger than 2/cm$^2$.

11. The single-crystal 4H-SiC substrate according to claim 3, wherein the epitaxial second single-crystal 4H-SiC layer is doped and is N-type.

12. The single-crystal 4H-SiC substrate according to claim 3, wherein the epitaxial second single-crystal 4H-SiC layer has an average surface roughness no larger than 0.3 nm.

* * * * *